(12) United States Patent
Yang

(10) Patent No.: US 6,730,548 B1
(45) Date of Patent: May 4, 2004

(54) METHOD OF FABRICATING A THIN FILM TRANSISTOR

(75) Inventor: Chien-Sheng Yang, Taipei (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/439,720

(22) Filed: May 16, 2003

(30) Foreign Application Priority Data

Jan. 9, 2003 (TW) ........................................ 92100397 A

(51) Int. Cl.⁷ .......................... H01L 21/00; H01L 21/84
(52) U.S. Cl. ........................ 438/149; 438/151; 438/197; 438/479; 438/517; 438/163; 257/57; 257/59; 257/E21.143; 257/344; 257/408; 257/66; 257/347; 257/72; 349/39; 349/141; 349/167; 349/288
(58) Field of Search ................................ 438/149, 163, 438/164, 166, 30, 45, 57, 487, 48, 151, 301, 725, 479, 517, 197; 257/57, 59, E21.143, 344, 408, 66, 347, 72; 349/39, 141, 167, 288

(56) References Cited

U.S. PATENT DOCUMENTS

| | | | | |
|---|---|---|---|---|
| 5,637,519 A | * | 6/1997 | Tsai et al. ............. | 438/160 |
| 5,780,903 A | * | 7/1998 | Tsai et al. ............. | 257/344 |
| 6,121,660 A | * | 9/2000 | Yamazaki et al. ...... | 257/348 |
| 6,624,443 B2 | * | 9/2003 | Tanabe et al. ......... | 257/59 |
| 2002/0146870 A1 | * | 10/2002 | Chen et al. ............ | 438/151 |
| 2002/0149016 A1 | * | 10/2002 | Yamazaki et al. ..... | 257/59 |
| 2002/0182789 A1 | * | 12/2002 | Park ..................... | 438/163 |
| 2002/0182833 A1 | * | 12/2002 | Yang .................... | 438/587 |
| 2003/0030080 A1 | * | 2/2003 | Dai et al. .............. | 257/288 |
| 2003/0207503 A1 | * | 11/2003 | Yamazaki et al. ..... | 438/149 |
| 2003/0209709 A1 | * | 11/2003 | Tanabe et al. ......... | 257/59 |

* cited by examiner

Primary Examiner—Matthew Smith
Assistant Examiner—Belur Keshavan
(74) Attorney, Agent, or Firm—Ladas & Parry

(57) ABSTRACT

A method of fabricating a thin film transistor for liquid crystal display is provided. A polysilicon island and a gate insulating layer covered on the polysilicon island are formed on a substrate. A metal layer is formed on the gate insulating layer. A pair of trenches exposing predetermined regions of the polysilicon island are formed in the metal layer and the gate insulating layer. P-type impurities are doped into the uncovered polysilicon regions of the polysilicon island. A gate electrode is formed by removing parts of the metal layer and the gate insulating layer. N-type impurities are doped into the exposed portions of the polysilicon island. Thereby LDD regions, and a source and a drain regions are formed at the regions doped with both n-type and p-type impurities and at the regions doped with only n-type impurities respectively.

17 Claims, 9 Drawing Sheets

METHOD OF FABRICATING A THIN FILM TRANSISTOR

BACKGROUND OF THE INVENTION

1. Field of the Invention

The present invention relates to a method of fabricating a thin film transistor (TFT), and more particularly, to a method using low-temperature polysilicon to fabricate a thin film transistor with symmetrical lightly doped drain (LDD) regions.

2. Description of Related Art

FIG. 1A to FIG. 1F are cross-sectional diagrams illustrating a method of fabricating a thin film transistor in the prior art.

Referring to FIG. 1A, a buffer layer 2 and a polysilicon layer 3 are sequentially formed on a substrate 1. An insulating layer 4, for example silicon oxide or silicon nitride, is deposited by CVD (chemical vapor deposition) on the buffer layer 2 in order to cover the polysilicon layer 3, as shown in FIG. 1B. A metal layer 5, for example aluminum or molybdenum, and a photoresist layer are formed on the insulating layer 4 sequentially. Then with lithography and etching, the photoresist layer is patterned into a patterned photoresist layer 6 with a first pattern. By taking the photoresist layer 6 as an etch protection layer, the metal layer 5 and the insulating layer 4 uncovered with the photoresist layer 6 are removed to become a gate electrode 5 and a gate insulating layer 4, respectively. After the photoresist layer 6 is removed, the polysilicon layer 3 is doped with n-type impurities of low dosage except for the region which is blocked and covered with the gate insulating layer 4 and the gate electrode 5.

Referring to FIG. 1D, another photoresist layer 7 is formed on the boundaries of the gate insulating layer 4 and the gate electrode 5. The polysilicon layer 3 is doped with n-type impurities of high dosage using the photoresist layer 7 as a mask. Thus a source region 8 and a drain region 9 are formed in the polysilicon layer 3 not blocked and covered with the second photoresist layer 7 and the gate insulating layer 4, and LDD (lightly doped drain) regions 14 are formed in the polysilicon layer 3 contacting the photoresist layer 7.

Further, referring to FIG. 1E, an insulating interlayer 10 is deposited over the entire surface of the structure after the photoresist layer 7 is removed. With lithography and etching, first contact holes 13 exposing the source and drain regions 8 and 9 are formed in the insulating interlayer 10. A source and a drain electrode 11 and 12, connected electrically to the source and drain regions 8 and 9, are then formed in the contact holes 13. Aluminum metal is used for source and drain electrodes 11 and 12.

Referring to FIG. 1F, a passivation layer 15 is formed on the insulating interlayer 10 to cover the source and drain electrodes 11 and 12. The passivation layer 15 is made of insulating material such as silicon oxide or silicon nitride. A second contact hole 17 exposing the drain electrode 12 is then formed in the passivation layer 15. A pixel electrode 16 is formed on the passivation layer 15 and connected electrically to the exposed drain electrode 12. In this case, the pixel electrode 16 is made up of a substance having transparent and electrically conductive properties.

As shown in FIG. 1D, the conventional process results in the formation of the unsymmetrical photoresist when the layer 7 lies over the gate electrode 5 on the polysilicon layer 3. The cause is misalignment during lithography.

In the liquid crystal display (LCD) panel processes, it is impossible to use only one exposure process to pattern a whole layer of a panel. In general, the LCD panel is divided into several regions, and several exposure processes are performed to the divided regions respectively. However, misalignment easily occurs in the exposing patterns in different regions. In FIG. 1D, $d_1$ and $d_2$ represent the thickness of the photoresist layer 7 at both sides of the gate electrode 5. If misalignment during lithography occurs, then the values of $d_1$ and $d_2$ are different, in some regions. For example, $d_1$ may be greater than $d_2$ in region, and maybe $d_1$ may be less than $d_2$ in other region. In this scenario, different sizes of LDD regions inevitably result.

The LDD structures are used to prevent the current in the region between the source and drain from leaking, and further to prevent the flickering problem. The conventional art teaches no reliable method for producing LDD structures with equal widths.

SUMMARY OF THE INVENTION

It is therefore an object of the present invention to provide a method of fabricating a thin film transistor having LDD regions of equal width, that is, symmetrical LDD regions.

To achieve the object of the present invention, the present invention provides a method of fabricating a thin film transistor, comprising the steps of providing a substrate; forming a polysilicon island on the substrate; forming a gate insulating layer on the polysilicon island; forming a metal layer on the gate insulating layer; forming a pair of trenches by removing the metal layer and the gate insulating layer until corresponding uncovered polysilicon regions are revealed; doping p-type impurities with a first dosage at the uncovered polysilicon regions in the polysilicon island; forming a gate electrode by removing parts of the metal layer and the gate insulating layer; and doping n-type impurities with a second dosage in the polysilicon island, wherein the regions doped with only n-type impurities are formed into a drain region and a source region on the both sides of the gate electrode, and the regions doped with both n-type and p-type impurities are formed into LDD regions.

Furthermore, the present invention provides a method of making thin film transistor for liquid crystal display panel, comprising the steps of: providing an insulating substrate; forming a buffer layer on the insulating substrate; forming a polysilicon island on the buffer layer; forming a gate insulating layer on the polysilicon island and the buffer layer; forming a metal layer on the gate insulating layer; forming a pair of trenches by removing the metal layer and the gate insulating layer until corresponding uncovered polysilicon regions are revealed; doping p-type impurities with a first dosage at the uncovered polysilicon regions in the polysilicon island; forming a gate electrode by removing parts of the metal layer and the gate insulating layer; doping n-type impurities with a second dosage in the polysilicon island, wherein the regions doped with only n-type impurities are formed into a drain region and a source region on the both sides of the gate electrode, and the regions doped with both n-type and p-type impurities are formed into LDD regions, wherein the gate electrode, the source, the drain and the LDD regions constitute a TFT (thin film transistor); forming an insulating interlayer on the buffer layer, wherein the insulating interlayer has first contact holes exposing a source and a drain region respectively; forming a source electrode and a drain electrode by filling up the first contact holes with metal; forming a passivation layer on the insulating interlayer, wherein the passivation layer has a second contact hole exposing the drain electrode; and forming a pixel electrode electrically connected to the drain electrode through the second contact hole.

The advantage of the present invention is that LDD regions with the same width are produced, thereby preventing the flickering problem.

BRIEF DESCRIPTION OF THE DRAWINGS

In order to fully understand the manner in which the above-recited and other advantages and objects of the invention are obtained, a more particular description of the invention briefly described above will be rendered by reference to specific embodiments thereof which are illustrated in the appended drawings. Understanding that these drawings depict only to typical embodiments of the invention and are not therefore to be considered limiting of its scope, the invention will be described and explained with additional specificity and detail through the use of the accompanying drawings in which.

DETAILED DESCRIPTION OF THE INVENTION

Reference will now be made in detail to the preferred embodiment of the prevention, examples of which are illustrated in the accompanying drawings.

Figure 1A:
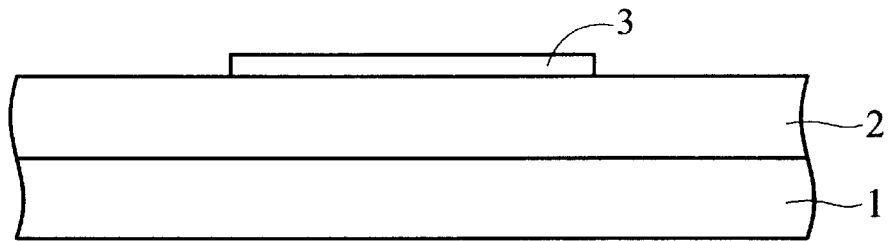
FIG. 1A to FIG. 1F are cross-sectional diagrams illustrating a method of fabricating a thin film transistor in the prior art.
Figure 1B:
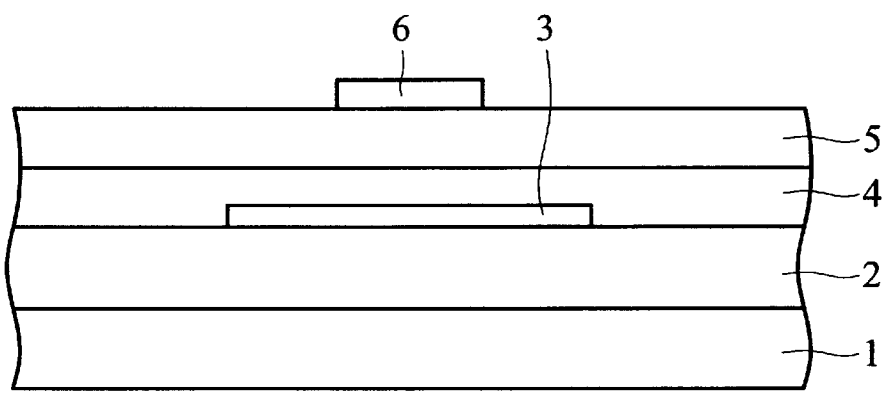
Figure 1C:
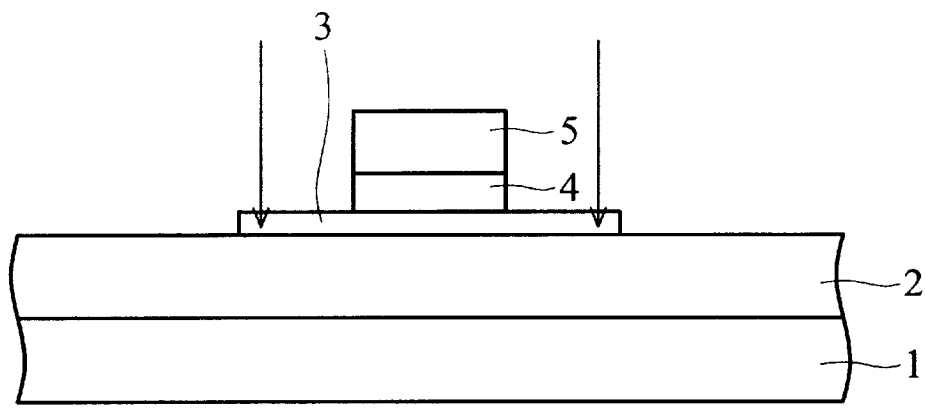
Figure 1D:
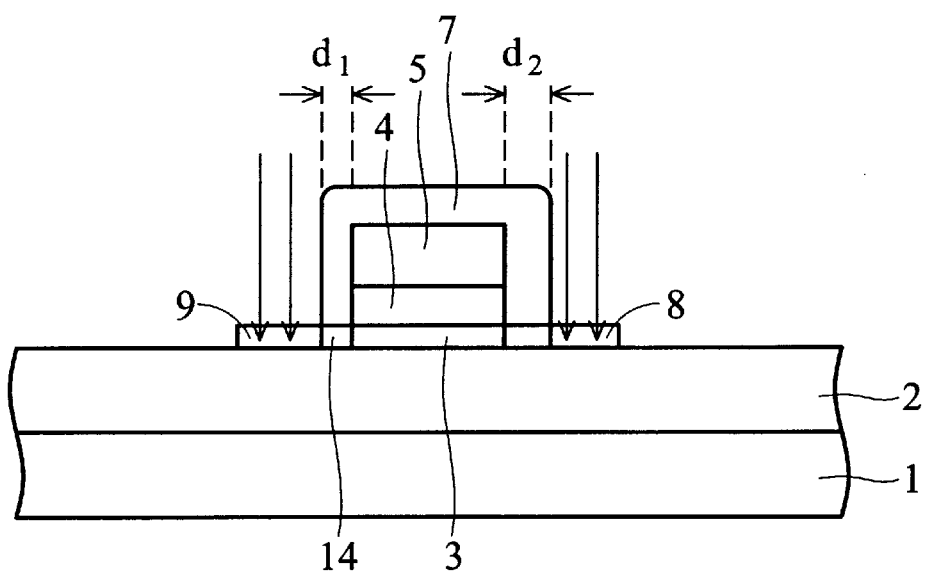
Figure 1E:
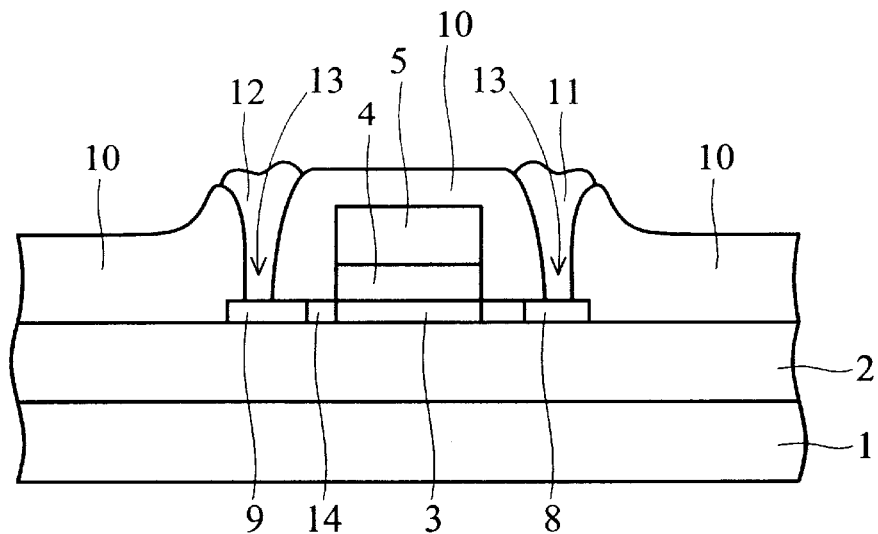
Figure 1F:
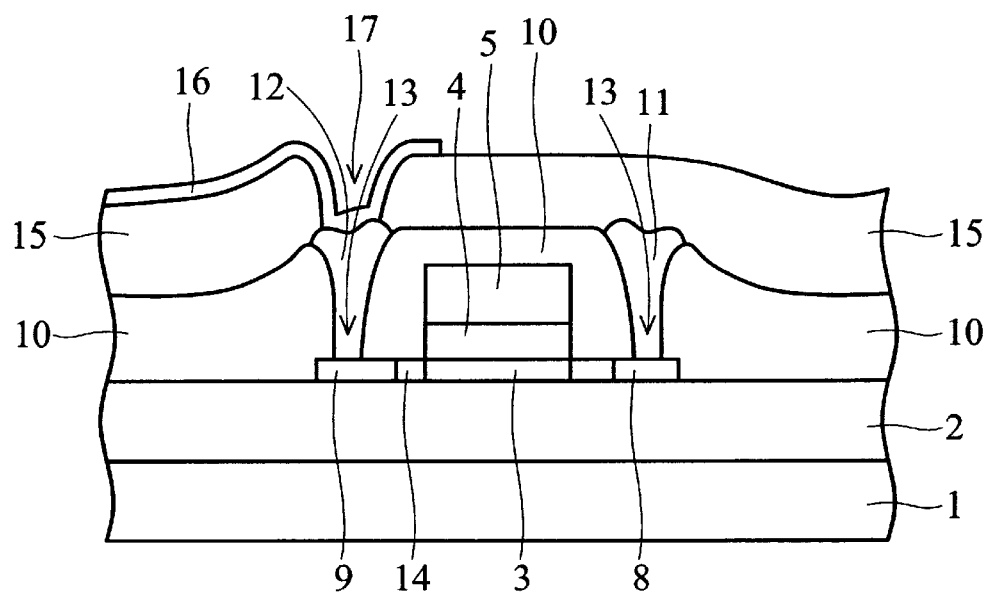
Figure 2A:
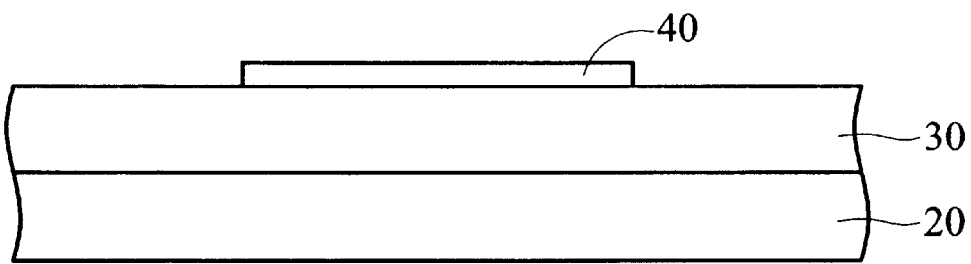
FIG. 2A to FIG. 2I are diagrams illustrating the method of fabricating a thin film transistor according to an embodiment of the present invention.

In FIG. 2A, a buffer layer 30 (also called as buffer oxidation layer) is deposited on a transparent, insulating substrate 20, such as glass substrate, by CVD (chemical vapor deposition). The buffer layer 30 is made up of materials such as silicon oxide or silicon nitride. A semiconductor island is formed on the buffer layer 30. The semiconductor island in the embodiment is the polysilicon island 40, and the semiconductor island can also be a poly-gallium arsenide island. The polysilicon island 40 can be formed by depositing an amorphous silicon layer on the buffer layer 30 followed by dehydration, crystallization and laser annealing, thereby transforming the amorphous silicon layer into a polysilicon layer. The laser annealing is radiated over the buffer layer 30 and can prevent the impurities in the insulating substrate 20 from diffusing into the polysilicon layer. The polysilicon layer is then patterned and etched into the polysilicon island 40. Alternatively, a polysilicon layer can be deposited directly with lower temperature on the buffer layer 30, and subjected to etching to form the polysilicon island 40.

Figure 2B:
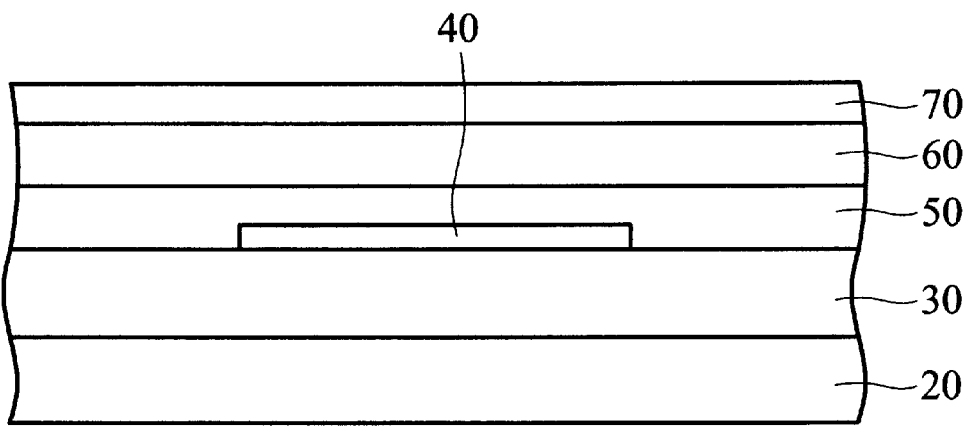

In FIG. 2B, a gate insulating layer 50, such as silicon oxide or silicon nitride, is formed on the polysilicon island 40 and the buffer layer 30 by chemical vapor deposition. Further, a metal layer 60 made of aluminum or molybdenum, and a first photoresist layer 70 are deposited on the gate insulating layer 50 sequentially.

Figure 2C:
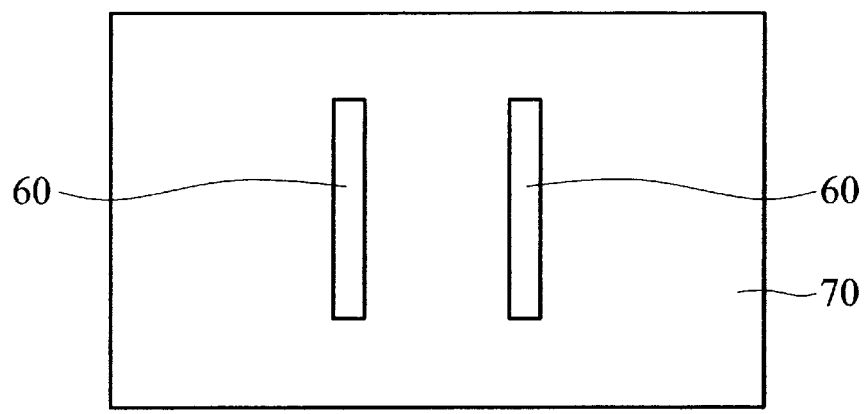

In FIG. 2C, it shows a top view of the above-mentioned stacked structure after lithography. The photoresist layer 70 is subjected to exposure and development, and a first pattern with a pair of trench regions is formed therein to expose apart of the underlying metal layer 60.

Figure 2D:
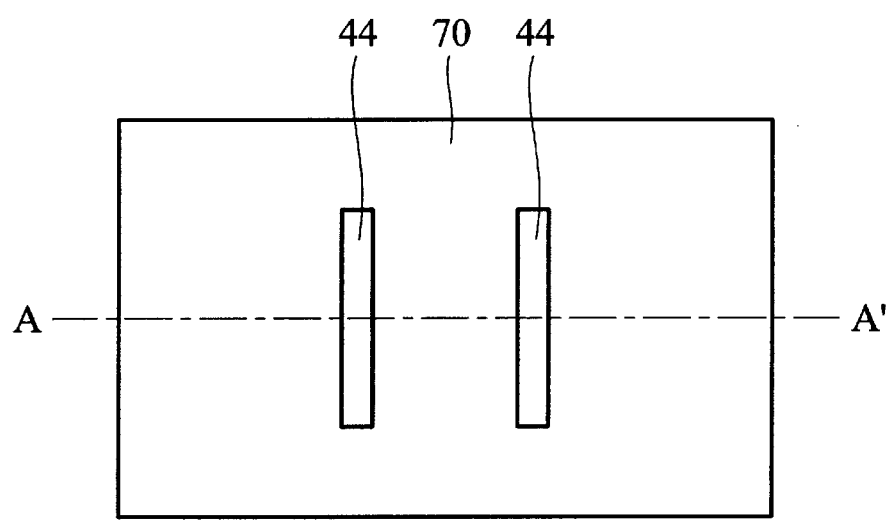
Figure 2E:
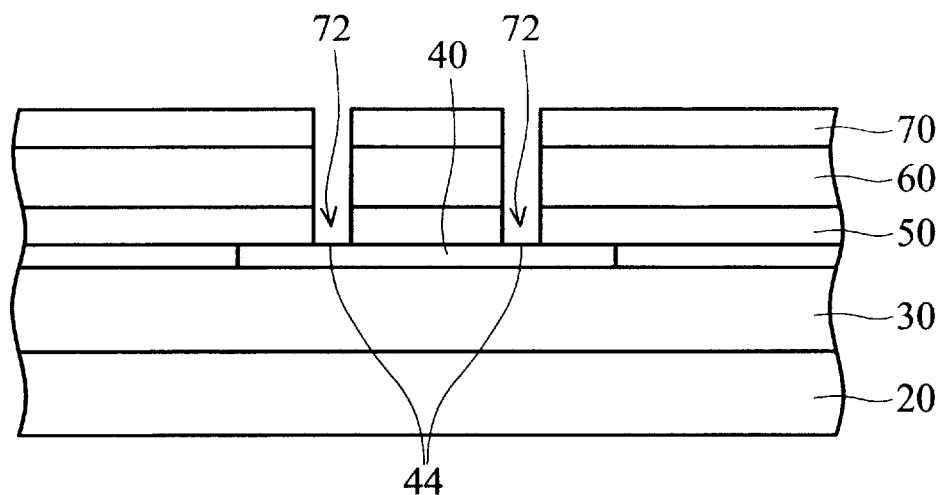

In FIG. 2D, it shows a top view of the above-mentioned stacked structure after etching. FIG. 2E shows a cross-sectional view according to the line A—A' in FIG. 2D. The metal layer 60 and the gate insulating layer 50 uncovered with the patterned photoresist layer 70 are removed by etching so as to form a pair of trenches 72 to expose the uncovered polysilicon region 44. An ion implantation step using p-type impurities, such as gallium ions, at a first dosage, such as $10^{12}$ cm$^{-3}$ for gallium ions, is performed to lightly dope the uncovered polysilicon regions 44 of the polysilicon island 40.

Figure 2F:
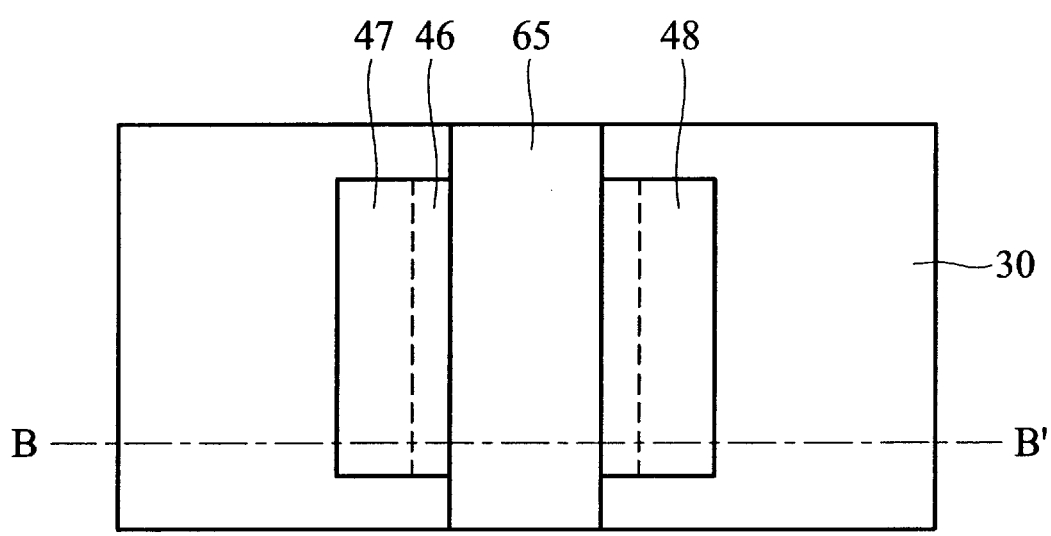
Figure 2G:
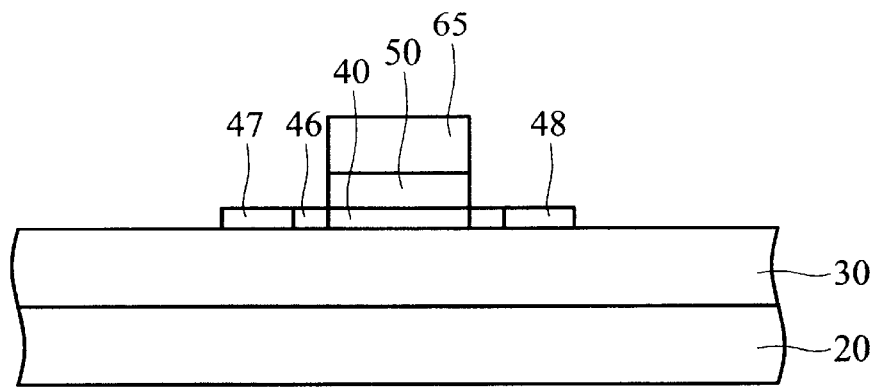

In FIG. 2F, it shows a top view of the above-mentioned stacked structure after forming a TFT with symmetrical LDD regions. FIG. 2G shows a cross-sectional view according to the line B—B' in FIG. 2F. A gate electrode 65 is formed between the pair of trenches 72 by removing the metal layer 60 and the gate insulating layer 50 beside the pair of trenches 72. Then, an ion implantation with n-type impurities, such as arsenic or phosphorous ions, at a second dosage, such as $10^{18}$ cm$^{-3}$ for arsenic or phosphorous ions, is performed to heavily dope the portion of the polysilicon island 40 which is not covered with the gate electrode 65. The regions doped with only n-type impurities are formed into drain and source regions 47 and 48 on the both sides of the gate electrode 65. The regions doped with both n-type and p-type impurities are formed into lightly doped regions 46. In this embodiment of the present invention, the first dosage must smaller than the second dosage for n-type TFT.

Figure 2H:
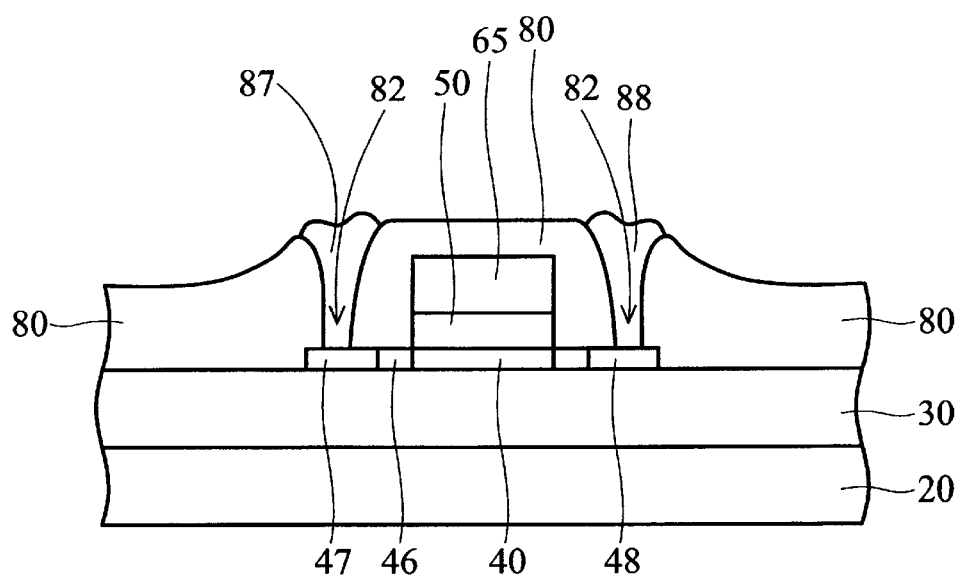

In FIG. 2H, an insulating interlayer 80, such as silicon oxide or silicon nitride, is deposited over the entire structure. First contact holes 82 that expose the drain and source regions 47 and 48 are formed in the insulating interlayer 80 using lithography and etching. Then, a drain and a source electrode 87 and 88 electrically connected to the drain region 47 and source region 48 through the first contact holes 82 are formed. The drain and source electrodes 87 and 88 are formed by, for example, depositing metal, such as aluminum, on the insulating interlayer 80 and filling the first contact holes 82 and following with lithography and etching.

Figure 2I:
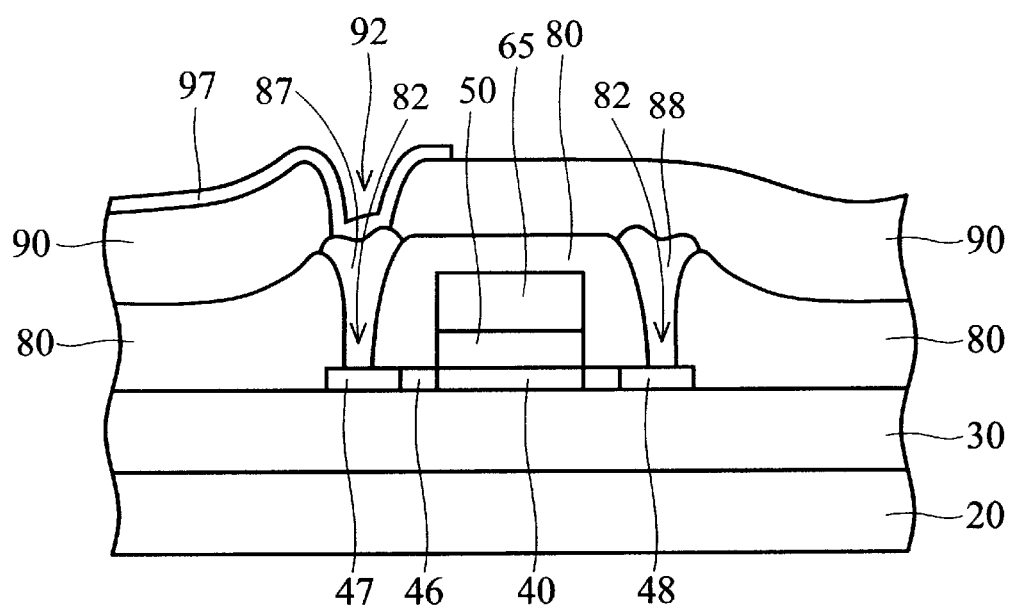

In FIG. 2I, a passivation layer 90 covering the drain and source electrodes 88 and 87 is formed by depositing an insulating substance, such as silicon oxide or silicon nitride. A second contact hole 92 is formed by removing a predetermined portion of the passivation layer 90 above the drain electrode 87. A pixel electrode 97 connecting the drain electrode 87 through the second contact hole 92 is formed by depositing an electrically conductive substance, such as ITO, on the predetermined region of the passivation layer 90.

Figure 3A:
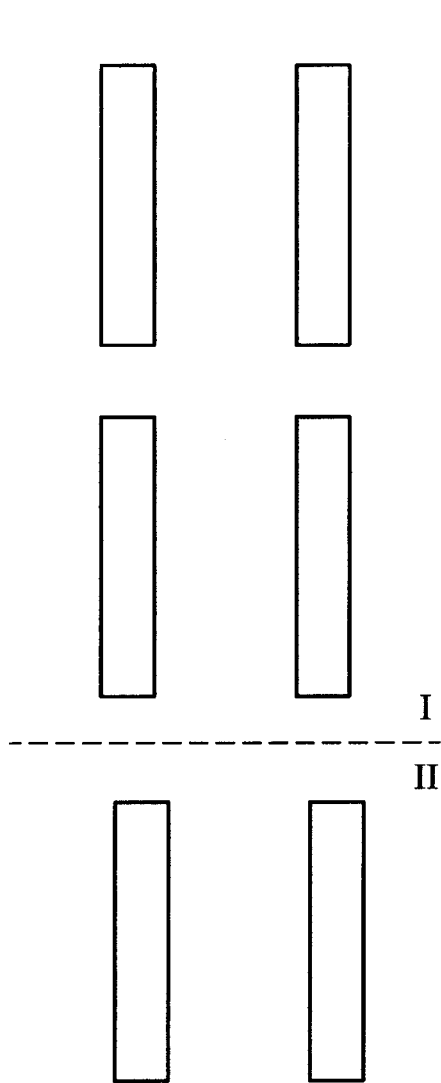
FIG. 3A is the top-view of a pair of trenches fabricated according the method of the present invention.

The above-mentioned pair of trenches 70 are symmetrical structures, helping to form symmetrical LDD regions 46. FIG. 3A shows a number of pairs of trenches formed by several exposure processes and a development process in a LCD panel according to the present invention. In FIG. 3 the trenches are divided into two regions, I and II, which are formed by different exposure processes. Note that the trenches in region II are misaligned relative to the trenches in region I as the result of misalignment during different exposure processes. Nevertheless, the trenches in the regions I and II are identical in size. Therefore, the same size of LDD regions can be formed in the LCD panel no matter how many times the exposure processes is performed.

Figure 3B:
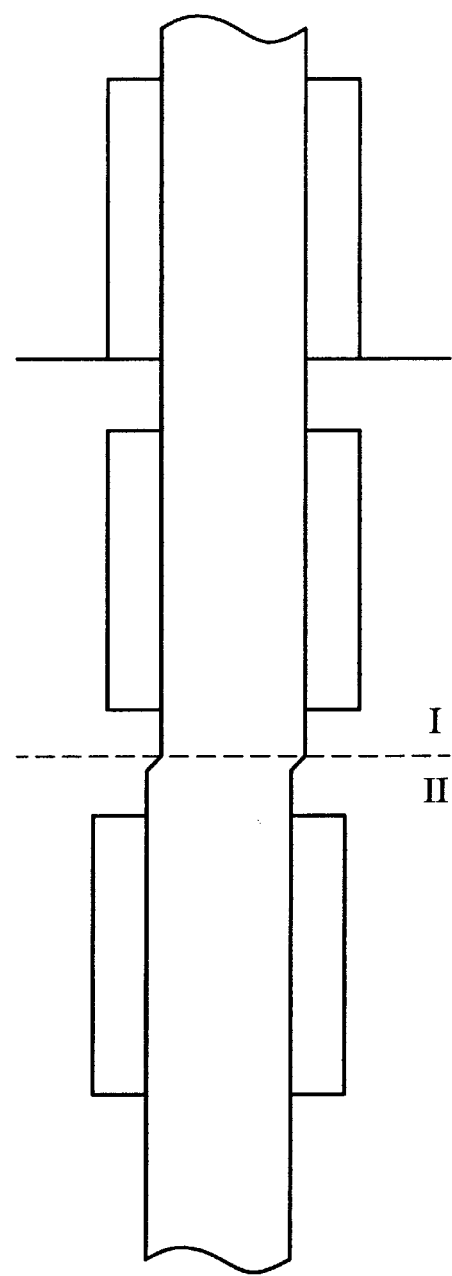
FIG. 3B is the top-view of a plurality of thin film transistors fabricated according the method of the present invention.

Further, FIG. 3B shows a plurality of transistors formed in the LCD panel according to the method of the present invention in the embodiment, which are also divided into region I and region II. Note that the gate electrodes in regions I and II respectively are also misalignment. However, both the LDD regions of the shown in regions I and II on both sides of the gate electrode are nevertheless identical in size. Therefore, each pixel controlled by its corresponding transistor has the same working state. Even when misalignment occurs, the method in the present invention can substantially reduce the problem of pixel current leakage and obtain higher quality image resolution.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a thin film transistor, comprising the steps of:

providing a substrate having a semiconductor island, a gate insulating layer and a metal layer;

forming a pair of trenches by removing the metal layer and the gate insulating layer until corresponding uncovered semiconductor regions are revealed;

doping p-type impurities with a first dosage at the uncovered semiconductor regions in the semiconductor island;

forming a gate electrode between the pair of trenches by removing the metal layer and the gate insulating layer beside the pair of trenches; and doping a n-type impurities with a second dosage in the semiconductor island not covered by the gate electrode, wherein the regions doped with only n-type impurities are formed into a drain region and a source region on both sides of the gate electrode, and the regions doped with both n-type and p-type impurities are formed into LDD regions.

2. The method as claimed in claim 1, wherein the semiconductor island can be a polysilicon island or a poly-gallium arsenide island.

3. The method as claimed in claim 1, wherein the substrate comprises a buffer layer.

4. The method as claimed in claim 1, wherein the step of forming the semiconductor island comprises the steps of:

forming an amorphous silicon layer on the substrate;

transforming the amorphous layer into a polysilicon layer by sequential steps of dehydration, crystallization, and laser annealing; and removing a portion of the polysilicon layer to leave a polysilicon island.

5. The method as claimed in claim 1, wherein the step of forming the semiconductor island comprises the steps of:

depositing a polysilicon layer on the substrate; and forming the polysilicon island by removing a portion of the polysilicon layer.

6. The method as claimed in claim 1, wherein the step of forming the pair of trenches comprises the step of:

forming a first photoresist layer on the metal layer; and exposing and developing the first photoresist layer to form a first pattern with a pair of trench regions therein; and etching the metal layer and the gate insulating layer to transfer the first pattern so as to reveal their corresponding uncovered polysilicon regions.

7. The method as claimed in claim 1, wherein the first dosage is smaller than the second dosage.

8. The method as claimed in claim 1, wherein the p-type impurities are doped by ion implantation.

9. The method as claimed in claim 1, wherein the n-type impurities are doped by ion implantation.

10. A method of making thin film transistor for liquid crystal display panel, comprising the steps of:

providing an insulating substrate having a buffer layer, a semiconductor island, a gate insulating layer and a metal layer;

forming a pair of trenches by removing the metal layer and the gate insulating layer until corresponding uncovered semiconductor regions are revealed;

doping p-type impurities with a first dosage at the uncovered semiconductor regions in the semiconductor island;

forming a gate electrode between the pair of trenches by removing the metal layer and the gate insulating layer beside the pair of trenches; and doping a n-type impurities with a second dosage in the semiconductor island not covered by the gate electrode, wherein the regions doped with only n-type impurities are formed into a drain region and a source region on the both sides of the gate electrode, and the regions doped with both n-type and p-type impurities are formed into LDD regions, wherein the gate electrode, the source, the drain and the LDD regions constitute a thin film transistor;

forming an insulating interlayer on the buffer layer, wherein the insulating interlayer has first contact holes exposing the source and the drain region respectively;

forming a source electrode and a drain electrode by filling up the first contact holes with metal;

forming a passivation layer on the insulating interlayer, wherein the passivation layer has a second contact hole exposing the drain electrode; and forming a pixel electrode electrically connected the drain electrode through the second contact hole.

11. The method as claimed in claim 10, wherein the semiconductor island can be a polysilicon island or a poly-gallium arsenide island.

12. The method as claimed in claim 10, wherein the step of forming the semiconductor island comprises the steps of:

forming an amorphous silicon layer on the buffer layer;

transforming the amorphous layer into a polysilicon layer by sequential steps of dehydration, crystallization, and laser annealing; and removing a portion of the polysilicon layer to leave a polysilicon island.

13. The method as claimed in claim 10, wherein the step of forming the semiconductor island comprises the steps of:

depositing a polysilicon layer on the buffer layer; and forming a polysilicon island by removing a portion of the polysilicon layer.

14. The method as claimed in claim 10, wherein the step of forming the pair of trenches comprises the step of:

forming a first photoresist layer on the metal layer; and exposing and developing the first photoresist layer to form a first pattern with a pair of trench regions therein; and etching the metal layer and the gate insulating layer to transfer the first pattern so as to reveal their corresponding uncovered polysilicon regions.

15. The method as claimed in claim 10, wherein the first dosage is smaller than the second dosage.

16. The method as claimed in claim 10, wherein the p-type impurities are doped by ion implantation.

17. The method as claimed in claim 10, wherein the n-type impurities are doped by ion implantation.

* * * * *